(12) United States Patent
Bergin et al.

(10) Patent No.: US 8,758,892 B2
(45) Date of Patent: Jun. 24, 2014

(54) THERMALLY CONDUCTIVE FOAM PRODUCT

(75) Inventors: Jonathan Bergin, Nashua, NH (US); Victoria Santa Fe, Manchester, NH (US); Christopher Severance, Derry, NH (US); Gary Rosa, Hudson, NH (US)

(73) Assignee: Parker Hannifin Corporation, Cleveland, OH (US)

( * ) Notice: Subject to any disclaimer, the term of this patent is extended or adjusted under 35 U.S.C. 154(b) by 42 days.

(21) Appl. No.: 13/203,785

(22) PCT Filed: May 5, 2010

(86) PCT No.: PCT/US2010/033684
§ 371 (c)(1),
(2), (4) Date: Oct. 25, 2011

(87) PCT Pub. No.: WO2010/129647
PCT Pub. Date: Nov. 11, 2010

(65) Prior Publication Data
US 2012/0048528 A1 Mar. 1, 2012

Related U.S. Application Data

(60) Provisional application No. 61/175,501, filed on May 5, 2009.

(51) Int. Cl.
*B32B 5/22* (2006.01)
*B32B 3/10* (2006.01)

(52) U.S. Cl.
USPC ............... 428/317.9; 428/131; 428/314.2

(58) Field of Classification Search
CPC ............ B32B 5/18; B32B 5/20; B32B 25/04; B32B 25/042; H01L 23/3733; H01L 2924/3011
USPC ................... 428/131, 319.7, 317.9, 314.2
See application file for complete search history.

(56) References Cited

U.S. PATENT DOCUMENTS

| 2,604,663 | A | 7/1952 | Talalay |
| 4,171,410 | A | 10/1979 | Frob |
| 5,060,114 | A | 10/1991 | Feinberg et al. |
| 6,033,506 | A | 3/2000 | Klett |
| 6,287,375 | B1 | 9/2001 | Klett |
| 6,531,771 | B1 * | 3/2003 | Schoenstein et al. ......... 257/720 |
| 6,784,363 | B2 | 8/2004 | Jones |
| 6,835,453 | B2 | 12/2004 | Greenwood et al. |

(Continued)

FOREIGN PATENT DOCUMENTS

WO    WO 2006119756 A1 * 11/2006

OTHER PUBLICATIONS

International Search Report of PCT/US2010/033684 dated Jun. 30, 2010.

*Primary Examiner* — Hai Vo
(74) *Attorney, Agent, or Firm* — Novak Druce Connolly Bove + Quigg LLP

(57) ABSTRACT

A compressible, thermally conductive foam interface pad is adapted for emplacement between opposed heat transfer surfaces in an electronic device. One heat transfer surface can be part of a heat-generating component of the device, while the other heat transfer surface can be part of a heat sink or a circuit board. An assembly including the foam interface pad and the opposed electronic components is also provided.

9 Claims, 1 Drawing Sheet

(56) References Cited

U.S. PATENT DOCUMENTS

| | | |
|---|---|---|
| 7,118,801 B2 | 10/2006 | Ristic-Lehmann et al. |
| 7,208,192 B2 | 4/2007 | Bunyan et al. |
| 7,804,030 B2 * | 9/2010 | Friedrich et al. ............ 174/252 |
| 2004/0241417 A1 | 12/2004 | Fischer et al. |
| 2007/0159789 A1 * | 7/2007 | Schuette et al. ............ 361/687 |
| 2007/0209833 A1 | 9/2007 | English |
| 2007/0246245 A1 | 10/2007 | Ahn et al. |

* cited by examiner

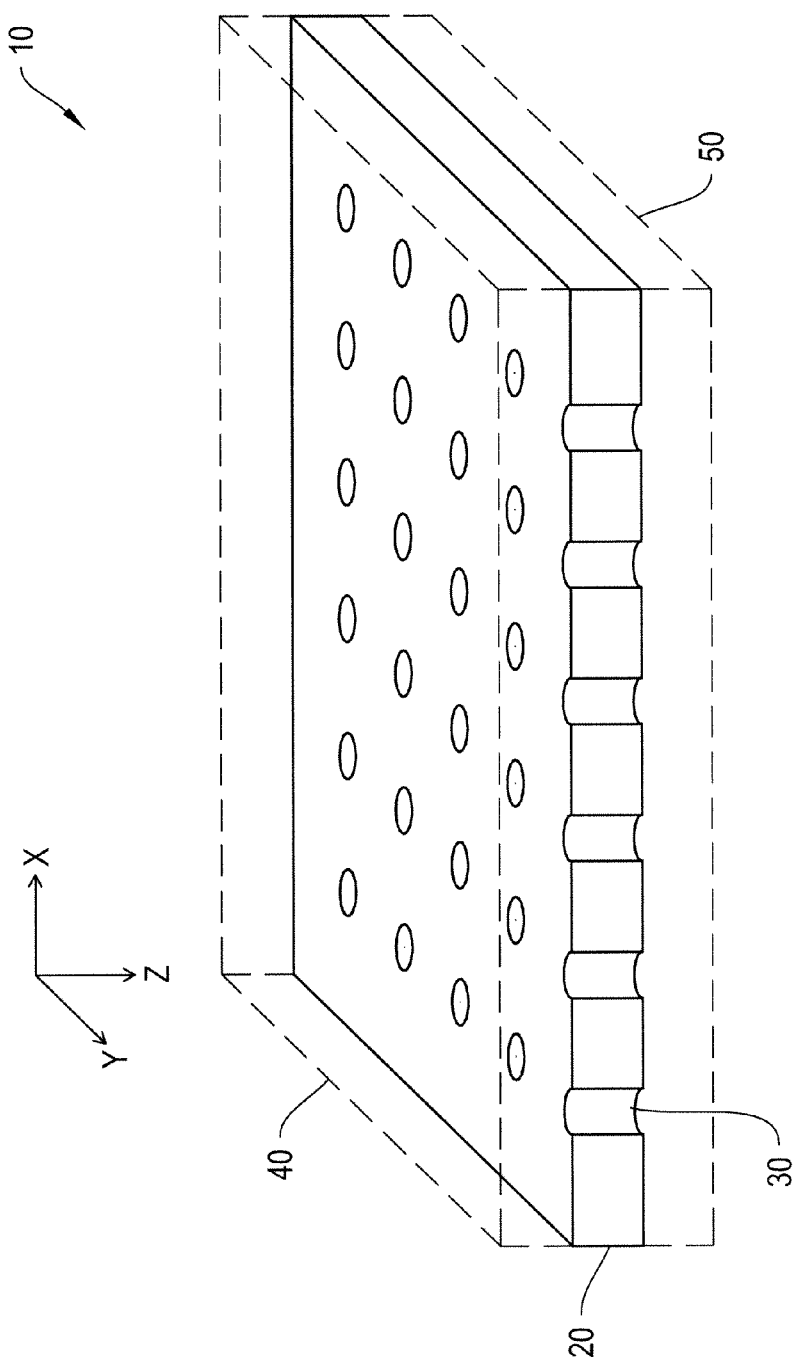

THERMALLY CONDUCTIVE FOAM PRODUCT

CROSS-REFERENCE TO RELATED APPLICATIONS

This application is a national phase application of PCT/US2010/033684, filed May 5, 2010, which claims the benefit of U.S. Provisional Application No. 61/175,501, filed on May 5, 2009, the disclosures of which are incorporated herein by reference.

BACKGROUND OF THE INVENTION

The present invention relates to a compressible, thermally conductive interface foam product adapted to be disposed between two heat transfer surfaces, such as an electronic component and a heat sink, to provide a thermal pathway between the surfaces. The thermally conductive foam interface product comprises a layer of a cured elastomeric material having air-filled voids passing at least partially through the interface, and a thermally-conductive particulate filler dispersed in the cured product. A thermal management assembly comprising the interface product and the two heat transfer surfaces is also provided. Preferably, the interface material is a silicone pad which is coated, molded or extruded and filled with ceramic fillers, such as $Al_2O_3$ or BN particles.

Conventional circuit designs for modern electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

In recent years, electronic devices have become smaller and more densely packed. Designers and manufacturers are now facing the challenge of dissipating the heat generated in these devices using various thermal management systems. Thermal management has evolved to address the increased temperatures created within such electronic devices as a result of the increased processing speed and power of these devices. The new generation of electronic components squeeze more power into a smaller space; and hence the relative importance of thermal management within the overall product design continues to increase.

An integral part of a thermal design process is the selection of the optimal Thermal Interface Material ("TIM") for a specific product application. New designs have been devised for thermal management to help dissipate the heat from electronic devices for further enhancing their performance. Other thermal management techniques utilize concepts such as a "cold plate", or other heat sinks which can be easily mounted in the vicinity of the electronic components for heat dissipation. The heat sink may be a dedicated, thermally-conductive metal plate, or simply the chassis or circuit board of the device.

To improve the heat transfer efficiency through the interface, a pad or other layer of a thermally-conductive, electrically-insulating material often is interposed between the heat sink and electronic component to fill in any surface irregularities and eliminate air pockets. Initially employed for this purpose were materials such as a silicone grease or wax filled with a thermally-conductive filler such as aluminum oxide. Such materials usually are semi-liquid or solid at normal room temperature, but may liquefy or soften at elevated temperatures to flow and better conform to the irregularities of the interface surfaces.

The greases and waxes of the aforementioned types generally are not self-supporting or otherwise form-stable at room temperature, and are considered to be messy to apply to the interface surface of the heat sink or electronic component. Consequently, these materials are typically provided in the form of a film, which often is preferred for ease of handling, a substrate, a web, or other carrier which introduces another interface layer in or between the surfaces in which additional air pockets may be formed. Moreover, the use of such materials typically involves hand application or lay-up by the electronics assembler which increases manufacturing costs.

Alternatively, another approach is to substitute a cured, sheet-like material in place of the silicone grease or wax. Such materials may contain one or more thermally-conductive particulate fillers dispersed within a polymeric binder, and may be provided in the form of cured sheets, tapes, pads, films and foams. Typical binder materials include silicones, urethanes, thermoplastic rubbers, and other elastomers, with typical fillers including aluminum oxide, magnesium oxide, zinc oxide, boron nitride, and aluminum nitride.

Foamed materials offer enhanced thermal transfer for certain applications such as for electronic equipment and circuit boards. Various methods for making such foamed materials have been previously described in the patent literature. U.S. Pat. No. 2,604,663 discloses a method for forming internal voids in a molded rubber article by subjecting the mold to extreme temperature changes. U.S. Pat. No. 4,171,410 discloses elastomeric, conductive foam articles prepared by coating strands of a non-conductive foam with conductive particles, and compressing and heating the foam.

U.S. Pat. No. 6,033,506 describes a method for making a foam product from carbon pitch by alternatively heating and cooling the pitch in a mold in the presence of an inert fluid applied under pressure. U.S. Pat. No. 6,287,375 also describes a carbon foam product made from pitch which is thermally conductive due to the inclusion of a particulate, such as carbon fiber, in the foam. The foam is described as having a thermal conductivity of at least about 43 W/mK. See, also, U.S. Pat. No. 7,118,801, relating to a moldable heat conducting material formed from aerogel particles contained in a polytetrafluoroethylene binder, and having a thermal conductivity of less than about 25 mW/mK.

U.S. Pat. No. 7,208,192 discloses the application of a thermally and/or electrically conductive compound to fill a gap between a first and second surface. A supply of fluent, form-stable compound is provided as an admixture of a cured polymer gel component and a particulate filler component. The compound is dispensed from a nozzle under an applied pressure onto one of the surfaces which is contacted with the opposing surface to fill the gap there between. U.S. Pat. No. 6,784,363 illustrates a compressible gasket having a plurality of vias extending through the gasket. The gasket is provided with electrically conductive layers for EMI shielding.

The respective disclosures of each of the patents and patent applications listed above are incorporated by reference herein in their entireties.

In view of the variety of materials and applications currently used in thermal management, as exemplified by the foregoing, it is to be expected that continued improvements in thermal management materials and applications would be well-received by electronics manufacturers.

Accordingly, it is an objective of the present invention to provide an improved thermal management product that has a high degree of heat transfer efficiency and heat dissipation, that is conformable to the particular application, and that is simple to use and manufacture.

SUMMARY OF THE INVENTION

A thermally conductive, compressible foam product is provided as a thermal interface interposed between first and second heat transfer surfaces. The thermal interface of the invention comprises a cured elastomeric polymeric material containing air-filled voids and thermally-conductive fillers dispersed therein. Preferably, the voids extend through the interface from a first surface contacting the first heat transfer surface, to a second opposed surface contacting the second heat transfer surface. An assembly including the thermal interface, a first heat transfer surface contacting one surface of the thermal interface, and a second heat transfer surface contacting a second opposed surface of the thermal interface are also provided.

The thermal interface product of the invention can be in the form of a preformed foam pad or a dispensed product, such as a foam or gel. The presence of a plurality of voids or vias provides for the compression of the normally incompressible product when subjected to an external force or load. It has been found that as the load on the thermal interface increases, the void volume decreases, resulting in increasing thermal conductivity with increasing load. This provides thermal interface products having unique compressibility features and that are not found on existing thermally conductive products.

In one embodiment of the invention, one of the heat transfer surfaces is a heat generating surface, preferably an electronic component, and the other heat transfer surface is a thermal dissipation member, such as a heat sink or circuit board. The compressible thermal interface is a foam pad preferably containing a plurality of vias, preferably cylindrical in shape, extending completely through the foam pad, as well as a conductive filler, providing a heat transfer path through the pad.

In another embodiment, the interface is a foam pad prepared from an elastomeric polymer containing from about 20% to about 80% by weight of a thermally conductive filler, such as metal and non-metal oxides, nitrides, carbides, diboride particles, graphite particles, metal particles, and combinations thereof. Typical elastomeric materials include polyurethanes, silicones, or neoprene. Preferably, the foam interface pad is a silicone pad containing $Al_2O_3$ or BN particles.

The compressible thermal interface foam pads of the present invention can be conveniently prepared from a solid foam pad by punching a plurality of vias completely through the pad with a cutting tool or die, and subsequently removing the chads. Alternatively, the plurality of vias can be molded into the pad during the pad manufacturing operation. Other methods for preparing the pads of the present invention will be readily apparent to those skilled in the art. Since the pad is compressible, it readily conforms to the first and second heat transfer surfaces, whether these surfaces are regular or irregular in shape. As the pad is compressed, the thermal conductivity increases, thereby enhancing the heat transfer from the electronic device to the heat sink.

BRIEF DESCRIPTION OF THE DRAWINGS

FIG. 1 is a perspective "exploded" cross-sectional view of the compressible elastomeric interface foam pad embodiment of the present invention depicting the plurality of vias or voids. The placement of the interface pad between opposed heat transfer surfaces is also shown.

Those skilled in the art will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

Certain terminology may be employed in the description to follow for convenience rather than for any limiting purpose.

DETAILED DESCRIPTION OF THE INVENTION

The invention provides, in one embodiment, a thermally conductive, compressible foam interface pad adapted to be positioned between two heat transfer surfaces of components used in electronic devices. The foam interface pad of the invention has improved heat transfer characteristics for enhanced thermal management as compared to other products currently in use.

As used herein, the term "thermal management" refers to the capability of keeping temperature-sensitive elements in an electronic device within a prescribed operating temperature in order to avoid system failure or serious system performance degradation.

A thermal "vias", as used herein, is a void extending substantially through the interface pad in a transverse ("z-axis") direction perpendicular to the plane ("x-y plane") of the opposing surfaces of the pad which contact the two heat transfer surfaces. The void can be any shape, but is preferably cylindrical and extends completed through the pad.

The term "elastomer", as used herein, describes thermoplastic and thermosetting polymers exhibiting rubber-like properties such as compliancy, resiliency or compression deflection, low compression set, flexibility, and the ability to recover after deformation. Exemplary elastomers include, among others, polyurethanes, styrene-isoprene-styrene, styrene-butadiene-styrene, plasticized nylons, polyesters, ethylene vinyl acetates, polyolefins and polyvinyl chlorides.

As described herein, the thermally conductive foam pad of the invention may be deployed within a thermal management assembly as a thermal interface material interposed between adjacent heat transfer surfaces. The heat transfer surfaces may be part of heat generating components, such as electronic components, or heat dissipation components, such as heat sinks or electronic circuit boards. However, one skilled in the art will readily appreciate that the present thermal interface pads can have other uses which are fully intended to be within the scope of the present invention. It will also be readily appreciated that a pre-formed foam interface pad is but one embodiment of the invention, and that other suitable alternatives can be used, such as dispensed foams and gels.

In accordance with the present invention, a thermally conductive interface is provided comprising a compressible elastomeric foam pad. The foam pad is rendered thermally conductive by incorporating a plurality of vias projecting through the pad to transfer heat from a heat generating surface to a heat absorbing surface. Additionally, the foam pad is also rendered thermally conductive by the incorporation of thermally conductive particles within the foam.

The thermally conductive particles of the invention can be included in the foam pad in a proportion sufficient to provide the thermal conductivity desired for the intended application, and generally will be loaded in an amount of between about 20% and about 80% by total weight of the foam pad. The particles can advantageously be incorporated in the foam pad using any number of conventional techniques well know in the art, such as by compounding, rolling, blending, etc.

The size and shape of the filler is not critical for the purposes of the present invention. In this regard, the filler may be of any general shape, referred to broadly as "particulate," including solid or hollow spherical or microspherical flakes, platelets, irregular or fibrous shapes, such as chopped or milled fibers or whiskers, but preferably will be a powder to assure uniform dispersal and homogeneous mechanical and thermal properties. The particle size or distribution of the filler typically will range from between about 0.01 mil to about 10 mil (0.25 µm-250 µm), which may be a diameter, imputed diameter, length, or other dimension of the particle, but may further vary depending upon the thickness of the gap to be filled.

Suitable thermally-conductive particulate fillers generally include metal and non-metal oxides, nitrides, carbides, diboride, graphite, and metal particles, and mixtures thereof, and more particularly boron nitride, titanium diboride, aluminum nitride, silicon carbide, graphite, metals such as silver, aluminum, and copper, metal oxides such as aluminum oxide, magnesium oxide, zinc oxide, beryllium oxide, antimony oxide, ceramics, and mixtures thereof. Such fillers characteristically exhibit a thermal conductivity of at least about 20 W/m-K. For reasons of economy, an aluminum oxide, i.e., alumina, may be used, while for reasons of improved thermal conductivity a boron nitride would be preferred. Loaded with the thermally-conductive filler, the foam interface pad typically may exhibit a thermal conductivity, per ASTM D5470, of at least about 0.5 W/m-K, which may vary depending upon the thickness of the pad.

The foam pad may be used with electronic equipment by emplacement intermediate a first heat transfer surface and a second heat transfer surface to provide a thermal pathway there between. One heat transfer surface can be a component designed to absorb heat, such as a heat sink or an electronic circuit board. The other (opposed) heat transfer surface can be a heat generating source, such as a heat generating electronic component. The opposed heat transfer surfaces preferably have a thermal impedance of less than about 1° C.-in$^2$/W (6° C.-cm$^2$/W).

Typical electronic equipment within the scope of the present invention include, by way of example, automotive electronic components and systems, telecom base stations, consumer electronics, such as computer monitors and plasma TVs, circuit boards, card cages, vents, covers, PCMCIA cards, back or face planes, shielding caps or cans, or I/O connector panels of an electronic device, or of an enclosure or cabinet therefore. It will be appreciated that aspects of the present invention may find utility in other applications requiring a resilient, thermally conductive interface pad. Uses within those such other applications therefore should be considered to be expressly within the scope of the present invention. The terminology employed herein is for convenience rather than for any limiting purpose.

Referring now to the FIG. 1, a thermal management assembly 10 is depicted in the exploded, cross-sectional view as including a component or part, depicted in phantom lines at 40, which has a first heat transfer surface in contact with foam pad 20. Foam pad 20 is also in contact with a second heat transfer surface of a component or part depicted in phantom lines at 50. If component 40 is a heat generating component, and component 50 is a heat absorbing component, then by way of illustration, heat will be transferred from component 40 through interface foam pad 20, to component 50 in an efficient manner. The efficiency of the heat transfer between the opposed surfaces generally increases with the compression of the interface pad 20. In one embodiment, a pressure-sensitive (PSA) or other adhesive (not shown), can be used to secure the foam interface pad in place between the two components.

As may be seen with continuing reference to FIG. 1, foam interface pad member 20, which for illustrative purposes is shown as a generally planar sheet or strip of indefinite extent, but which may be of any given extent and shape, includes a first surface in contact with component 40, and a second surface in contact with component 50. These surfaces of foam pad 20 generally extend in the x-y plane, and although the surfaces are depicted in FIG. 1 as being generally planar, they may be multi-planar, arcuate or curved, or complex curved. Thus, foam pad 20 is defined, in part, by a first surface and a second surface generally extending in an x-y plane, and a depth or thickness extending along a "z" axis as shown. For many applications, the foam pad thickness may be between about 10-1000 mils (0.254-25.4 mm), and typically, but not necessarily, will be small relative to the extents of the lengthwise or widthwise dimensions of pad 20 as defined along the x- and y-axes.

Foam interface pad 20 may be formed of an elastomeric material which specifically may be selected on the basis of one or more of the following parameters: operating temperature, compression set, force defection, flammability, compression set, or other chemical or physical properties. Depending upon the application selected, suitable materials may include thermoplastic of thermosetting polymers, including by way of illustration, polyethylenes, polypropylenes, polypropylene-EPDM blends, butadienes, styrene-butadienes, nitriles, chlorosulfonates, neoprenes, urethanes, silicones, and copolymers, blends and combinations thereof.

Interface pad 20 can be formed from an open or closed cell foamed elastomeric material. Preferred materials include silicone or polyurethane foams, such as an open cell, low modulus polyurethane foam having an average cell size of about 100 µm and, as may be measured, for example, in accordance with ASTM D 3574-95, a density of between about 15-30 lbs/ft$^3$, a compression set of less than about 10%, and a force-deflection of between about 1-9 psi (7–63 kPa). Such materials are marketed under the name Poron® 4700 by the Rogers Corporation, Woodstock, Conn. Other preferred materials include THERM-A-GAP™ G579, manufactured and sold by the Chomerics division of Parker Hannifin Corporation.

Further in accordance with the present invention, foam interface pad 20 is formed or otherwise provided with a plurality of vias, one of which is referenced at 30, wherein said plurality of vias extend through the thickness (z-dimension) of the pad as shown in FIG. 1. Each of the vias 30 may have an inner peripheral surface which may be generally cylindrical with a generally circular, elliptical, polygonal, or other closed geometric cross-section. The vias 30 may be regularly, i.e., uniformly spaced, or irregularly, i.e., non-uniformly spaced, distributed, and for most applications will have a diameter of between about 0.015-0.50 mils (0.38-12.7 mm). In this regard, foam interface pad 20 may have a "porosity" or open area of between about 5-20%.

The foam interface pad 20 itself may be formed by casting, extrusion, molding, or other conventional process. The vias 30 may be stamped, punched, die-cut, or otherwise processed into pad 20. In the production of commercial quantities, pad 20 can be cut from larger sheets or roll stock.

Additional fillers and additives may be included in the formulation of the elastomeric foam pad depending upon the requirements of the particular application envisioned. Such fillers and additives may include conventional wetting agents or surfactants, pigments, dyes, and other colorants, opacifying agents, anti-foaming agents, anti-static agents, coupling agents such as titanates, chain extending oils, tackifiers, pigments, lubricants, stabilizers, emulsifiers, antioxidants, thickeners, and/or flame retardants such as aluminum trihydrate, antimony trioxide, metal oxides and salts, intercalated graphite particles, phosphate esters, decabromodiphenyl oxide, borates, phosphates, halogenated compounds, glass, silica, silicates, and mica. Typically, these fillers and additives can be blended or otherwise admixed with the formulation, and may comprise between about 0.05-80% or more by total volume thereof.

The following example is intended to illustrate one aspect of the invention, without limiting it thereby.

EXAMPLE

A foam interface pad was prepared as follows. A THERM-A-GAP™ G579 product, manufactured and sold by the Chomerics division of Parker Hannifin Corporation, was evaluated for thermal conductivity at two thicknesses: 0.070 inches and 0.130 inches. A 0.070 hole punch was used to punch holes in the samples. Two different hole patterns were used. The first pattern had holes every 0.25 inches in the X direction and every 0.5 inches in the Y direction. The second pattern had holes every 0.25 inches in both the X and Y directions.

The pads were then tested for thermal impedance per ASTM 5470 and compression deflection.
Results:

| Sample # | Blank Area | Thickness (inches) | Thermal Impedance (10 PSI) in 2C/W | Force to Deflect 50% (lbs) |
| --- | --- | --- | --- | --- |
| 1 | ~20 | 0.070 | 1.0 | 38 |
| 2 | ~40 | 0.070 | 1.0 | 26 |
| 3 | ~20 | 0.130 | 1.5 | 31 |
| 4 | ~40 | 0.130 | 1.6 | 25 |

As it is anticipated that certain changes may be made in the present invention without departing from the precepts herein involved, it is intended that all matter contained in the foregoing description shall be interpreted as illustrative and not in a limiting sense. All references cited herein are expressly incorporated herein by reference thereto in their entirety.

What is claimed is:

1. A system comprising a compressible thermally-conductive foam interface pad disposed intermediate a heat generating member and an opposing thermal dissipation member to provide a thermal pathway there between, said interface pad comprising:
    a cured elastomeric polymer, the elastomeric polymer having a cross-section and two opposing faces; and
    a thermally-conductive particulate filler loaded in an amount ranging from 20 to 80% by weight of the interface pad, said filler dispersed in the cured elastomeric polymer,
    said interface pad in the form of a single pad containing a plurality of regularly spaced air-filled voids mechanically formed in the pad, said voids extending completely through the pad from one opposing face to the other, said pad having an open area of between about 5% and 20%, a thermal impedance in the range from 1.0 to 1.6° C.-in$^2$/W, and a 50% compression deflection in the range from 25 to 38 lbs.

2. The system of claim 1 wherein the heat generating member is an electronic component and the thermal dissipation member is a heat sink.

3. The system of claim 1 wherein the elastomeric polymeric material comprises silicone or polyurethane.

4. The system of claim 1 wherein the pad is pre-formed or dispensed.

5. The system of claim 1 wherein the voids are generally cylindrical in shape.

6. The system of claim 1 wherein the elastomeric polymer is selected from the group consisting of polyethylenes, polypropylenes, polypropylene-EPDM blends, butadienes, styrene-butadienes, nitriles, chlorosulfonates, neoprenes, urethanes, silicones, and copolymers, blends and combinations thereof.

7. The system of claim 1 wherein the particulate filler is selected from the group consisting of metal and non-metal oxides, nitrides, carbides, diboride particles, graphite particles, metal particles, and combinations thereof.

8. The system of claim 1 wherein the filler has a thermal conductivity of at least about 20 W/m-K.

9. The system of claim 1 wherein the interface pad has a thermal conductivity of at least about 0.5 W/m-K.

* * * * *